(12) United States Patent
Pickett et al.

(10) Patent No.: US 8,611,133 B2
(45) Date of Patent: Dec. 17, 2013

(54) STATEFUL NEGATIVE DIFFERENTIAL RESISTANCE DEVICES

(75) Inventors: Matthew D. Pickett, San Francisco, CA (US); Frederick A. Perner, Santa Barbara, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 81 days.

(21) Appl. No.: 13/346,219

(22) Filed: Jan. 9, 2012

(65) Prior Publication Data

US 2013/0176766 A1    Jul. 11, 2013

(51) Int. Cl.
G11C 11/00    (2006.01)
G11C 13/00    (2006.01)

(52) U.S. Cl.
CPC .................. *G11C 13/0069* (2013.01)
USPC ........... 365/148; 365/100; 365/113; 365/151; 365/153

(58) Field of Classification Search
CPC .......... G11C 13/0014; G11C 2213/77; G11C 13/025; G11C 11/56; G11C 2213/81
USPC ........................ 365/148, 100, 113, 151, 153
See application file for complete search history.

(56) References Cited

U.S. PATENT DOCUMENTS

| | | | |
|---|---|---|---|
| 6,072,716 A | 6/2000 | Jacobson et al. | |
| 7,480,174 B2 | 1/2009 | Lee et al. | |
| 7,701,748 B2 | 4/2010 | Lee et al. | |
| 2008/0113464 A1 | 5/2008 | Savransky | |
| 2010/0102289 A1 | 4/2010 | Dimitrov et al. | |
| 2011/0037558 A1 | 2/2011 | Campbell | |
| 2012/0105159 A1* | 5/2012 | Strachan et al. | 331/2 |

OTHER PUBLICATIONS

Ielmini, D.; "Threshold Switching Mechanism by High-field Energy Gain in the Hopping Transport of Chalcogenide Glasses"; Jul. 8, 2008; pp. 1-8; vol. 78; Issue: 3; http://prb.aps.org/abstract/PRB/v78/i3/e035308.
Chen, F. et al.; "S-shaped Negative Differential Resistance Modeling in Electro-thermal Simulation of Phase-change Memory Programming"; Oct. 13-Nov. 2007; pp. 67-70; http://ieeexplore.ieee.org/xpl/freeabs_all.jsp?arnumber=4389949.

* cited by examiner

*Primary Examiner* — Thong Q Le

(57) ABSTRACT

A stateful negative differential resistance device includes a first conductive electrode and a second conductive electrode. The device also includes a first material with a reversible, nonvolatile resistance that changes based on applied electrical energy and a second material comprising a differential resistance that is negative in a locally active region. The first material and second material are sandwiched between the first conductive electrode and second conductive electrode. A method for using a stateful NDR device includes applying programming energy to the stateful NDR device to set a state of the stateful NDR device to a predetermined state and removing electrical power from the stateful NDR device. Power-up energy is applied to the stateful NDR device such that the stateful NDR device returns to the predetermined state.

20 Claims, 8 Drawing Sheets

US 8,611,133 B2

STATEFUL NEGATIVE DIFFERENTIAL RESISTANCE DEVICES

BACKGROUND

Negative Differential Resistance (NDR) is a property displayed by some devices where an increase in current across the device results in a decreased voltage across the device in some operational regimes. Similarly, an increase in voltage across an NDR device may result in a decreased amount of current. NDR devices have the potential to dramatically increase the speed of computing devices. However, implementation of NDR devices has been hampered by a number of challenges, such as incompatibility of NDR materials (e.g. indium phosphide, gallium arsenide) with silicon and the high power requirements to maintain the state of NDR devices when the NDR devices are not in active use.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Negative differential resistance (NDR) is "locally active" in the region where the differential resistance of the device is negative. In this region, the device can be used for signal restoration or gain if it is correctly biased in an appropriate circuit. However, under certain biasing and circuit conditions the NDR operating region is unstable, and the device will quickly switch to a stable operating point on the current-voltage (I-V) curve where the differential resistance is positive. There are two different types of NDR: so-called 'N-' (named because of the shape of the I-V curve) or Voltage-Controlled NDR (VC-NDR) and 'S-' or Current-Controlled NDR (CC-NDR).

NDR leads to the ability to make oscillators and a wide variety of other circuits that would normally require transistors. However, there is at least one major challenge in implementing NDR devices. NDR devices draw power to hold state, and therefore circuits with NDR elements dissipate a lot of energy even when they are not performing any useful function.

This specification describes a number of illustrative stateful NDR devices, circuits, and methods for allowing stateful NDR devices to go into a "rest" mode that holds the state of the NDR device with low or zero applied power. In general, this is accomplished by introducing nonvolatile hysteresis in the I-V behavior of the stateful NDR device. Using the nonvolatile hysteresis, the stateful NDR device reverts to its previous state when it is powered up. These stateful NDR devices have the all the advantages that have been posited for NDR circuit elements without the consuming power needlessly to maintain state.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

Figure 1A:
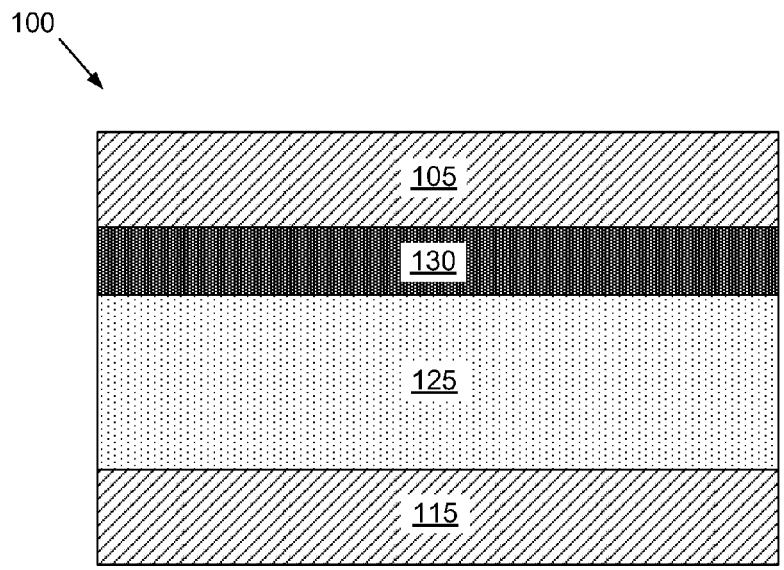
FIGS. 1A and 1B are cross sectional diagrams of illustrative NDR devices, according to one example of principles described herein.

FIG. 1A is a cross sectional diagram of an illustrative stateful NDR device (100) that includes a top electrode (105), a memristive element (130) formed from a first material, a film of a second material (125) that exhibits NDR behavior, and a lower electrode (115). Memristive elements (130) are nonlinear systems that exhibit reversible and nonvolatile resistance changes that depend on the magnitude and duration of applied electrical energy. Unipolar memristance refers to a material that exhibits nonvolatile changes in resistance when programmed by a unipolar voltage. For example, a first programming voltage may be applied to a unipolar memristive element. The first programming voltage alters the electrical resistance of the unipolar memristive element (130) to a low resistance state. After the first programming voltage is removed, the unipolar memristive device maintains the low resistance state until another programming voltage is applied. In general, voltages applied to the unipolar memristive element during the normal operation of the NDR device (100) are below the voltage threshold which would alter the state of the unipolar memristive element. A second programming voltage with the same polarity as the first programming voltage, but different magnitude can be applied to the unipolar memristive element to change its resistance to a high resistance state. Without being bound by any particular theory of operation, it appears that the first programming voltage may create a metallic phase conductive filament. This metallic phase conductive filament dramatically reduces the electrical resistance through the memristive element. Applying a second programming voltage of the same polarity, but different magnitude is used to dissipate the metallic phase conductive filament and increase the electrical resistance of the memristive element (130). Examples of materials that can be used to form unipolar memristive elements include nickel oxide (NiO), and silicon oxide ($SiO_2$).

Additionally or alternatively, a bipolar memristive element can be used within the stateful NDR device (100). Bipolar memristive elements are typically programmed by applying a first programming voltage with a first polarity to achieve an increase or decrease in electrical resistance and a second programming voltage with an opposite polarity to reverse the change in electrical resistance and return the memristive element to its prior state. Bipolar memristive elements may be formed from a variety of materials including tantalum oxide ($Ta_2O_5$), hafnium oxide ($HfO_2$), titanium oxide ($TiO_2$), and zirconium oxide ($ZrO_2$).

The electrodes (105, 115) can be formed from any of a variety of conductive materials, such as metals, alloys, conductive polymers, doped semiconductors or other suitable materials. The stateful NDR device (100) may be formed as an independent component or as part of an integrated circuit.

Figure 1B:
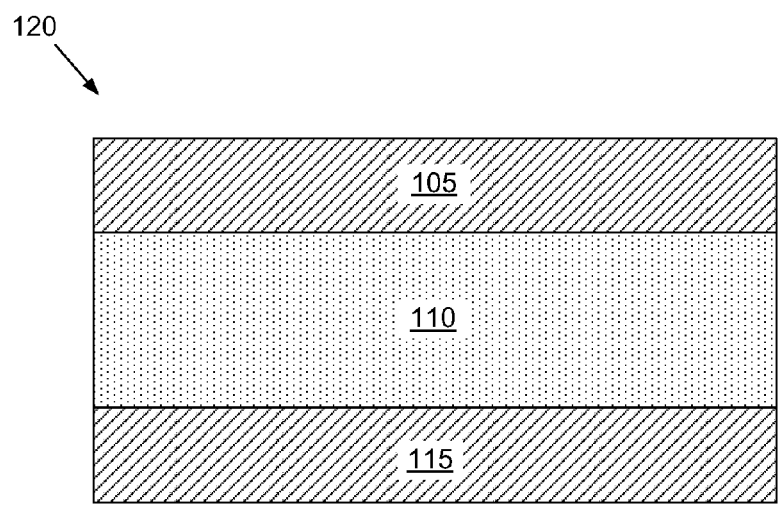

FIG. 1B is a cross sectional diagram of a stateful NDR device (120) that includes a switching layer (110) sandwiched between an upper contact (105) and a lower contact (115). The switching layer (110) has both NDR and memristor characteristics. The memristive characteristics of the switching layer (110) may be programmed using unipolar or bipolar techniques. Materials that can be used to create a switching layer (110) with both NDR and memristive characteristics include titanium oxide ($TiO_x$), vanadium oxide ($VO_2$) and niobium oxide ($NbO_2$).

Figure 2A:
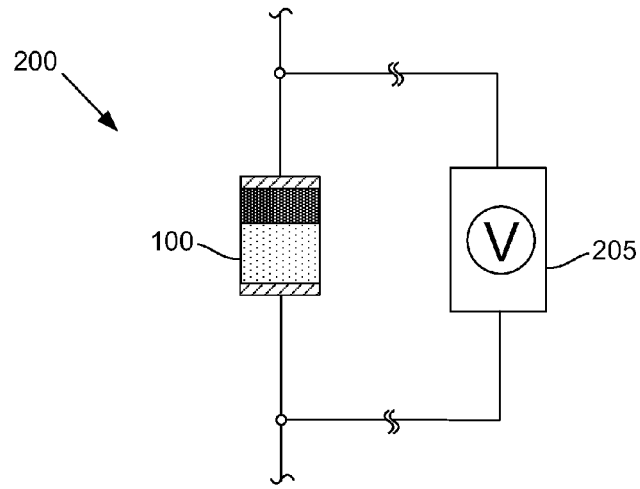
FIGS. 2A and 2B are, respectively, a circuit diagram and a graph of the operation of a voltage controlled NDR device, according to one example of principles described herein.

FIGS. 2-4 show various systems and methods for operating the voltage controlled operation of a stateful NDR device. FIG. 2A shows a circuit (200) that includes a stateful NDR device (100) and a voltage control component (205). The voltage control component (205) includes a variable voltage source V. The voltage control component (205) is electrically connected to the stateful NDR device (100) and applies a controlled voltage across the stateful NDR device (100). Although the stateful NDR device is illustrated as having a distinct memristive and NDR layer as shown in FIG. 1A, the stateful NDR device may also have a combined memristive and NDR layer as shown in FIG. 1B.

Figure 2B:
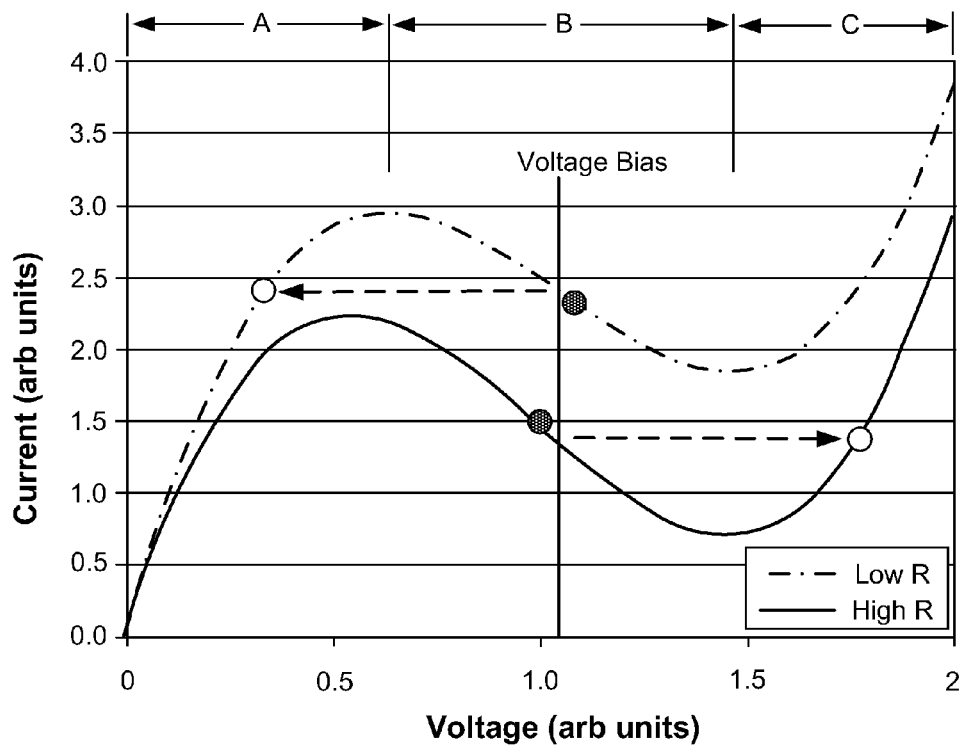

FIG. 2B is a current-voltage (I-V) graph of the characteristics of the stateful NDR device. In this case, the NDR device is referred to as an N-NDR device, because the I-V curve has an N shape. The horizontal axis shows applied voltage and the vertical axis shows current through the device. The upper dash dot curve represents the I-V behavior of the stateful N-NDR device (100) when the memristive element has a low electrical resistance (ON state). Because the memristive element has a low electrical resistance, relatively high amount of current flows through the stateful N-NDR device (100) for a given voltage. The lower solid curve represents the I-V behavior of the stateful N-NDR device when the memristive element has a high electrical resistance (OFF state). For example, the N-NDR device may include a small amount of unipolar memristance, either extrinsically as a thin film of unipolar memristance material that is incorporated into the device as shown in FIG. 1A or intrinsically as a part of the materials properties of the device as shown in FIG. 1B. This memristance material shifts the I-V curve so that the N-NDR device remembers its previous state when the power is shut down. The upper curve is created by the combination of a low memristor resistance and the N-NDR curve of the NDR material. The lower curve is created by a combination of a high memristor resistance and the NDR curve of the NDR material. The offset of the two curves is the change of resistance in the memristive element.

In general, the N-NDR curve can be divided into three sections. A first section A is on the left of the graph where increasing low voltages result in increasing current flow through the device. A second section B is in the center of the graph where increasing voltages result in lower current flow through the device, and a third section C is on the right of the graph where increasing voltages again result in higher currents passing through the device. The center section B of the I-V graph shows the negative differential resistance behavior of the device.

The shaded dots represent the location of the metastable point on each curve. The metastable point is located at the point of maximum negative slope on each curve. If the device is initially in its low resistance or ON state (represented by the upper curve), the current is high and the internal temperature gradient in the device is large. This will cause oxygen vacancies to migrate inward by the Soret effect or thermophoresis to form conductive filaments between the two electrodes, and thus yield a lower resistance for the unipolar memristance. In this case, the change in resistance is nonlinear and has the effect of shifting the metastable point for the threshold switch down in current along the dash dot curve as shown by the dashed arrow pointing to the left. As discussed above, once these conductive filaments are formed they remain in place until another programming voltage is applied to the device. When the device is powered down and then back up, the device returns to the ON state if the initial current bias is higher than the metastable point of the dash dot curve. Conversely, if the device is initially in its OFF or high resistance state (shown by the lower solid curve), the current is low and the temperature gradient is smaller—this will cause oxygen vacancies to diffuse outward and thus increase the resistance of the unipolar memristor. The change in resistance is nonlinear and the metastable point on the solid I-V curve shifts up to higher voltage. Powering the device down and then back up will ensure that the device returns to the OFF state if the voltage bias is below the metastable point of the lower I-V curve.

Thus, the stateful N-NDR device retains a memory of its previous state even when powered down. The N-NDR can then be powered up and operates along the same I-V curve as before it was powered down. Switching the device from one state to the other requires an appropriate voltage to be applied that is different from the "power-up" voltage bias.

Figure 3A:
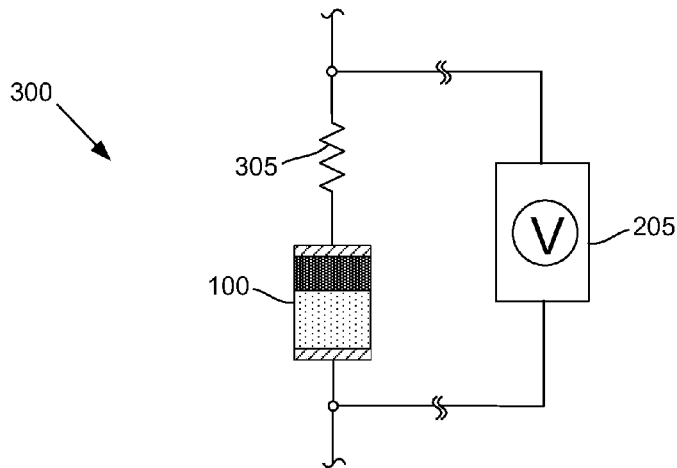
FIGS. 3A and 3B are, respectively, a circuit diagram and a graph of the operation of a voltage controlled NDR device, according to one example of principles described herein.
Figure 3B:
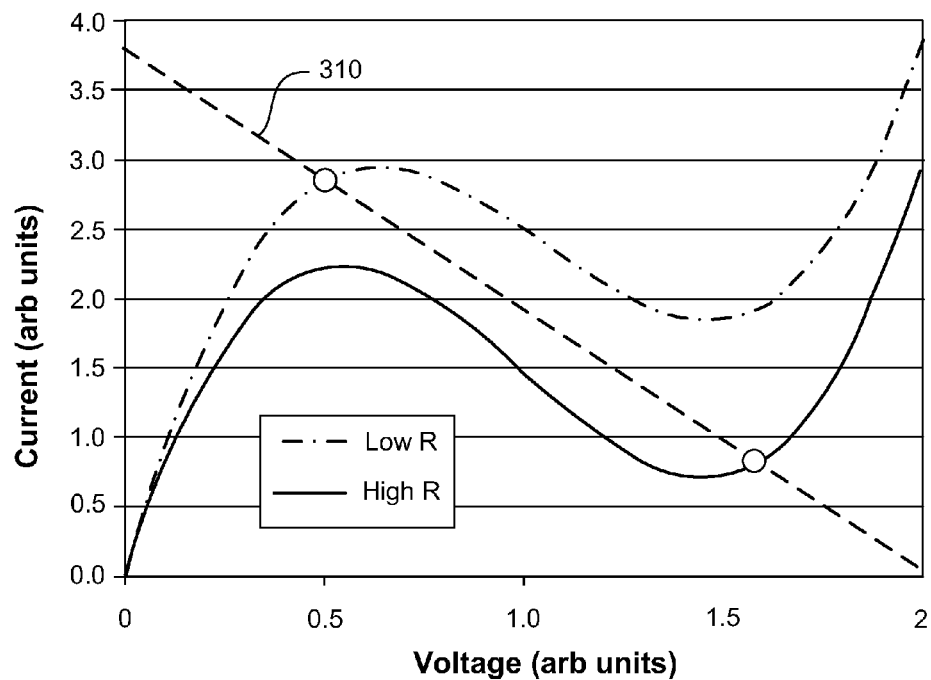

FIGS. 3A and 3B describe a biasing scheme that uses a linear load line to distinguish state. FIG. 3A is a circuit diagram of a circuit (300) that includes a stateful N-NDR device (100) placed in series with a linear resistor (305). A voltage source (205) applies a voltage across the stateful N-NDR device (100) and the linear resistor (305).

FIG. 3B is a graph of I-V curves for the circuit (300). A load line (310) intersects the low resistance I-V curve (shown by the dash-dot curve) and the high resistance I-V curve (shown by the lower solid curve). The load line (310) is illustrated as being substantially linear in this example and intersects each of the I-V curves in only one location. During the power-up phase the state of the N-NDR device can be distinguished since there is only one stable operating point for each of the nonvolatile resistance conditions. Consequently, the biasing scheme illustrated in FIGS. 3A and 3B does not require a nonlinear resistance change but can operate even with a linear resistance.

Figure 4A:
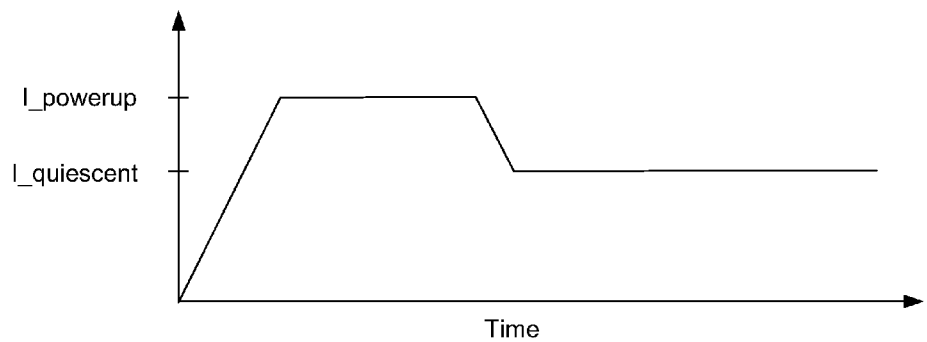
FIGS. 4A and 4B are, respectively, a current time line for power up of a voltage controlled NDR device and a graph of the operation of the voltage controlled NDR device, according to one example of principles described herein.
Figure 4B:
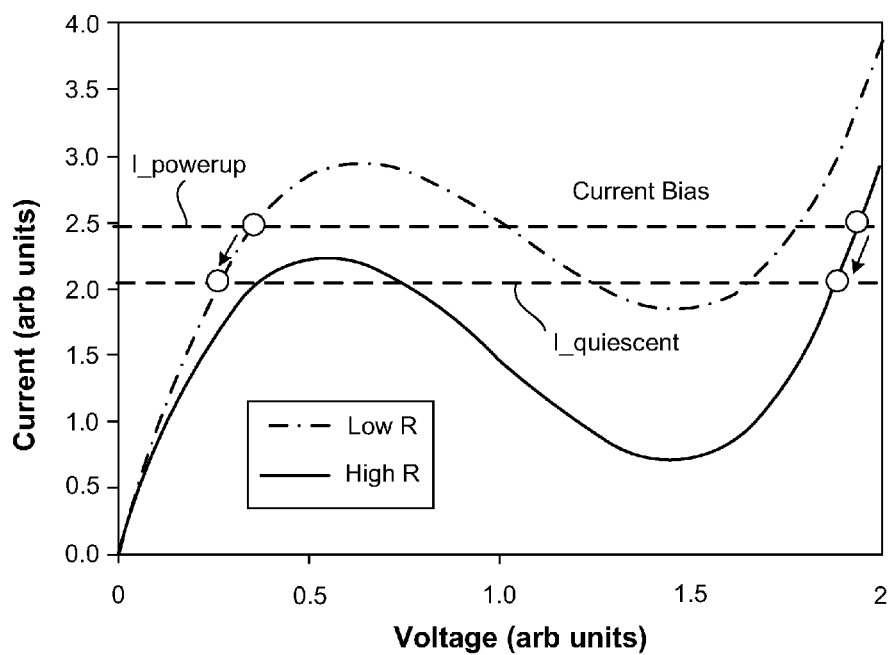

The third biasing scheme is a two-step power-up cycle illustrated in FIGS. 4A and 4B. This technique initially applies a current bias that copies the nonvolatile state to the threshold switch and then reduces the current to a quiescent state-holding current. FIG. 4A is a graph of current applied to an NDR device as a function of time. Initially, the NDR device is at rest with no current flowing. The NDR device is then powered up by applying a power-up current (I_powerup). The power-up current is applied for a period of time and is reduced to a quiescent current (I_quiescent).

FIG. 4B is a graph of I-V curves for the NDR device. The horizontal axis shows applied voltage and the vertical axis shows current through the device. As discussed above, there are two I-V curves. A first I-V curve (solid curve) shows the behavior of the device when the memristive element is in a high resistance state and a second I-V curve (dash dot curve) shows the behavior of the device when the memristive element is a low resistance state. The power-up current (I_powerup) is the upper dash line and the quiescent current (I_quiescent) is the lower dashed line. As shown in FIG. 4B, the power-up current intersects both the low resistance I-V curve and the high resistance I-V curve. The state of the device is shown as circles at the intersections between the current lines and the I-V curves. In this example, when the power-up current is applied to the device with a low memristive resistance, the initial state of the device in the low resistance I-V curve has a current of 2.5 and a voltage of about 0.4. When the current is reduced to the quiescent current, the state of the device has a current of 2.0 and a voltage of about 0.3 volts.

When the power-up current is applied to the device with a high memristive resistance, the initial state of the device in the high resistance I-V curve has a current of 2.5 and a voltage of about 1.8. When the current is reduced to the quiescent current, the state of the device has a current of 2.0 and a voltage of about 1.7 volts. The voltage and current units are arbitrary and are intended only to illustrate the operation of the device, not to show quantitative behavior.

For the three schemes discussed in FIGS. 2-4, when powered up, the N-type NDR device will go into the appropriate state, depending on its memristance and the previous state of the threshold switch. This new property offered by oxide NDR devices is not available with previous NDR devices based on other materials and physical mechanisms, and thus could provide a major advantage over these other technologies. However, the idea of using unipolar memristance, whether nonlinear or linear, to provide a memory of the state of a threshold switch is quite general, and can be applied to a wide variety of NDR devices by adding a series unipolar memristor to the device.

Three illustrative methods for operating a stateful S-type NDR device are shown in FIGS. 5-7. As discussed above, the S-type NDR devices are current controlled. If such an NDR device has a small amount of unipolar memristance, either intrinsically as a part of the materials properties of the device (see FIG. 1B) or extrinsically as a thin film of unipolar memristance material that is incorporated into the device (see FIG. 1A), the device can remember its previous state when the power is shut down.

Figure 5A:
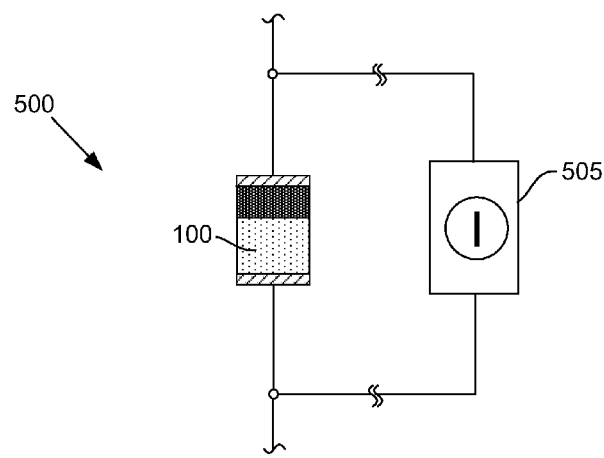
FIGS. 5A and 5B are, respectively, a circuit diagram and a graph of the operation of a current controlled NDR device, according to one example of principles described herein.

FIGS. 5-7 show various systems and methods for current controlled operation of a stateful S-NDR device. FIG. 5A shows a circuit (500) that includes a stateful NDR device (100) and a current control component (505). The current control component (505) includes a variable current source I. The current control component (505) is electrically connected to the stateful NDR device (100) and applies a controlled current across the stateful NDR device (100).

Figure 5B:
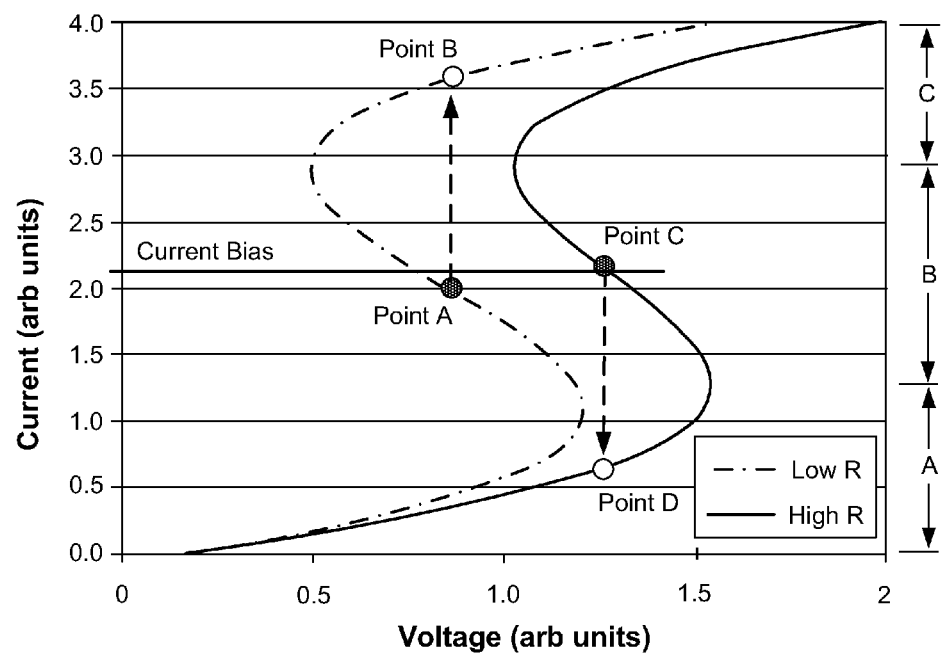

FIG. 5B is a current-voltage (I-V) graph of the characteristics of the current controlled NDR device (100). In this case, the NDR is referred to as an S-NDR device, because the curve it creates results in an S shape The dash-dot curve on the left represents the I-V behavior of the stateful S-NDR device (100) when the memristive element has a low electrical resistance (ON state). Because the memristive element has a low electrical resistance, the voltage is relatively low for a given amount of current flowing through the device. The solid curve on the right represents the I-V behavior of the stateful S-NDR device when the memristive element has a high electrical resistance (OFF state). For example, the S-NDR device may include a small amount of unipolar memristance, either extrinsically as a thin film of unipolar memristance material that is incorporated into the device as shown in FIG. 1A or as a single layer that exhibits both memristive and NDR properties as shown in FIG. 1B. This memristance material shifts the I-V curve so that the S-NDR device remembers its previous state when the power is shut down. The offset between the two curves is the change of resistance in the memristive element.

In general, the S-NDR curve can be divided into three sections. A first section A is on the lower section of the graph where increasing current through the device results in increasing voltage across the device. A second section B is in the middle section of the graph where increasing current through the device results in lower voltages across the device, and a third section C is on the top section of the graph where increasing currents through the device again result in higher voltages across the device. The middle section B of the I-V graph shows the negative differential resistance behavior of the device.

One power-up scheme for the circuit described in FIGS. 5A and 5B includes applying a current bias. If the S-NDR device is in its ON state (low resistance state), the current bias induces memristive switching which further lowers the resistance of the device and moves the current/voltage relationship from point A to point B. Point A is the metastable point on the low resistance I-V curve and corresponds to the maximum negative slope of the curve. If the device is initially in its low resistance or ON state, the current is high and the internal temperature gradient in the device is large. This will cause oxygen vacancies to migrate inward by the Soret effect or thermophoresis, and thus yield a lower resistance for the unipolar memristance.

If the S-NDR device is in its OFF state (high resistance state) the metastable point C will be shifted to a higher resistance state shown by point D. This occurs because the current is low and the temperature gradient is smaller. This will cause oxygen vacancies to diffuse outward and thus increase the resistance of the unipolar memristor. If the change in resistance is nonlinear, the metastable point on the solid I-V curve shifts up to a higher current. Powering the device down and then back up will ensure that the device returns to the OFF state if the current bias is below the metastable point C.

In the ON state, an initial current bias is supplied that is slightly higher than the metastable point A of the device. In the OFF state, the initial current bias is supplied that is below the metastable point C of the device. The nonlinear hysteresis between the high resistance curve and the low resistance curve should be sufficient to shift the metastable point of the device up or down enough so that there is a digital operating current that can be applied with sufficient operating margin between the two metastable points. The current bias can then be selected so that it is less than the metastable point C for the high resistance I-V curve and higher than metastable point A on the low resistance I-V curve.

Figure 6A:
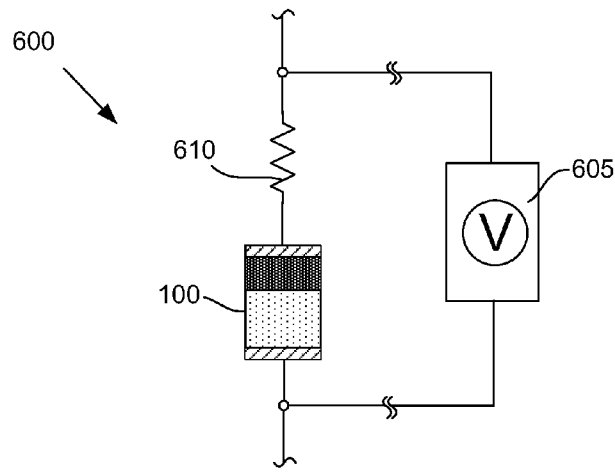
FIGS. 6A and 6B are, respectively, a circuit diagram and a graph of the operation of a current controlled NDR device, according to one example of principles described herein.
Figure 6B:
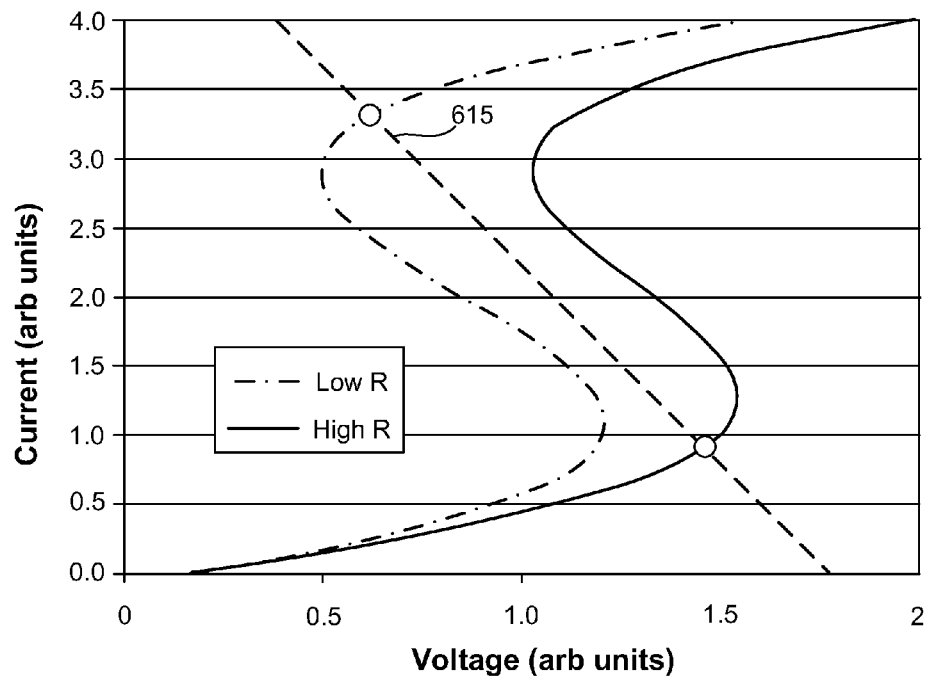

Another power-up scheme for a current controlled NDR device is shown in FIGS. 6A and 6B. FIG. 6A shows a circuit (600) that includes a stateful NDR device (100), a voltage component (605) and a series resistance (610). The low resistance curve is represented as a dash-dot curve and the high resistance curve is shown as a solid line. This power-up scheme uses a load line (615, FIG. 6B) during the power-up phase in order to distinguish state, since only one stable operating point is available on each of the I-V curves. The load line (615, FIG. 6B) is created by an appropriate series resistance (610, FIG. 6A) and current source (605, FIG. 6A).

Figure 7A:
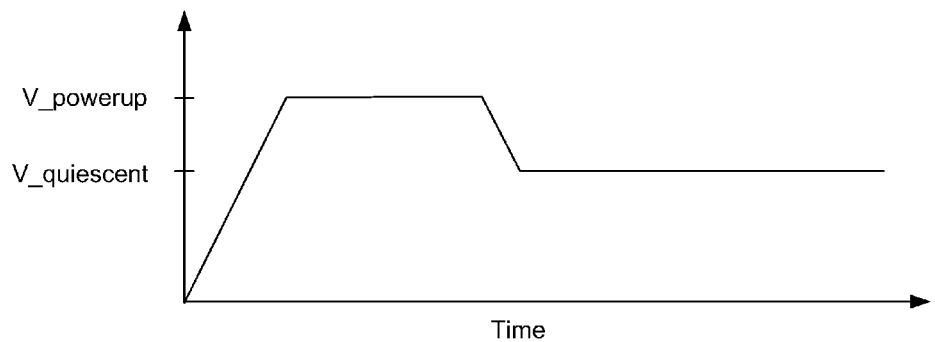
FIGS. 7A and 7B are, respectively, a voltage time line for power up of a current controlled NDR device and a graph of the operation of the current controlled NDR device, according to one example of principles described herein.
Figure 7B:
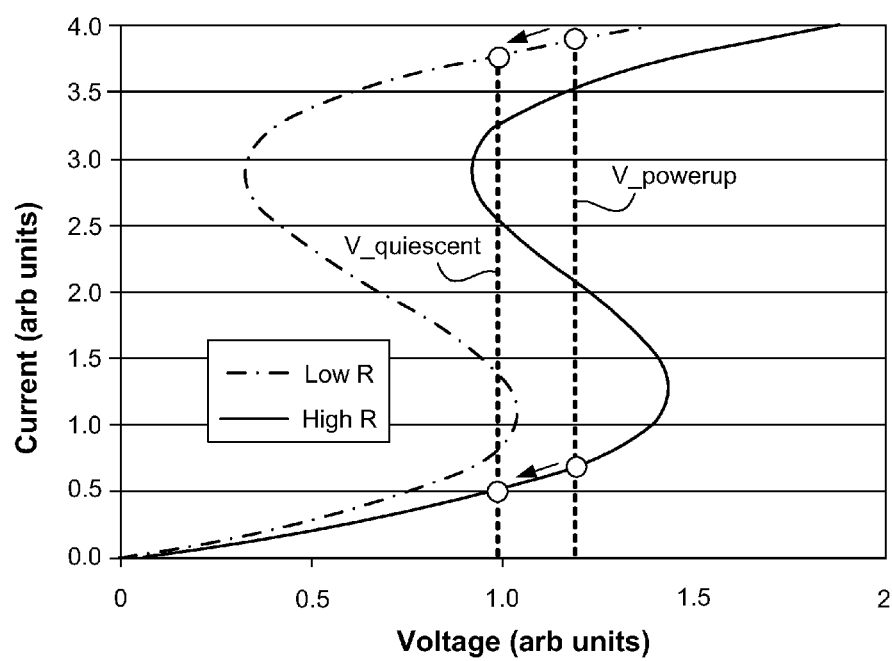

The third power-up scheme is shown in FIGS. 7A and 7B and uses a two-step power up cycle. The low resistance curve is represented as a dash-dot curve and the high resistance curve is shown as a solid line. First, a voltage (V_powerup, FIG. 7A) is applied which is sufficient to turn ON the NDR device if the nonvolatile memristive element is in the low resistance state, but insufficient to turn ON the device if the nonvolatile memristive element is in the high resistance state. The voltage is then reduced to a quiescent level (V_quiescent, FIG. 7A) which goes through the bistable operating points of both the ON and OFF states in order maintain state during operation. This is illustrated in FIG. 7B, as motion of the vertical dashed voltage lines moving toward the left.

For all three schemes, when powered up, the threshold switch will go into the appropriate state, depending on the previous state of the NDR device as captured in the memristive element. This is a new property offered by oxide S-NDR devices that was not available with previous S-NDR devices based on other materials and physical mechanisms, and thus could provide a major advantage over these other technologies. However, the idea of using unipolar memristance, either nonlinear or linear, to provide a memory of the state of the threshold switch is quite general, and can be applied to a wide variety of NDR devices by adding a series nonlinear unipolar memristor to the device.

Figure 8:
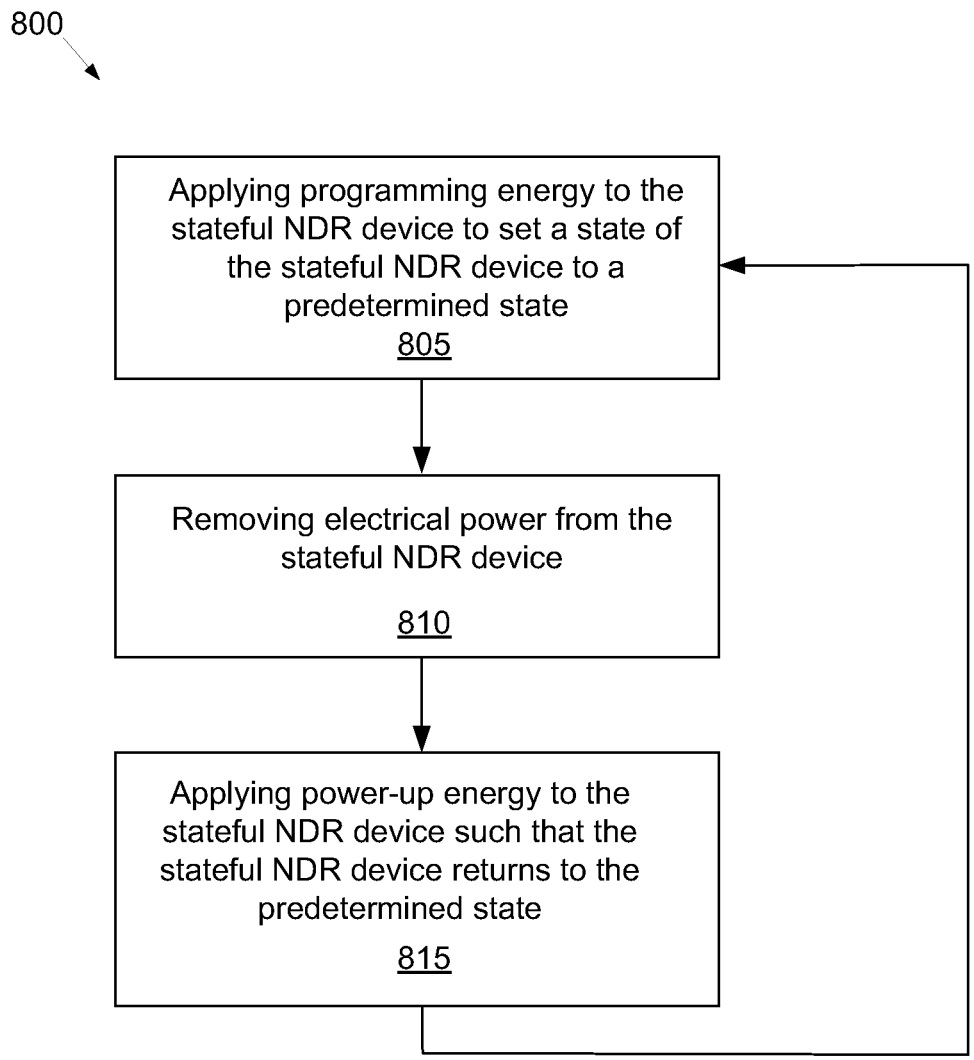
FIG. 8 is a flowchart of an illustrative method for operation of stateful NDR devices, according to one example of principles described herein.

FIG. 8 is a flowchart of an illustrative method for operation of stateful NDR devices. The method includes applying programming energy to the stateful NDR device to set a state of the stateful NDR device to a predetermined state (block 805). This programming energy may be a voltage or current and may act on the stateful NDR device in a number of ways. For example, the programming energy may produce Joule heating that alters the distribution of electrical carriers within the device. Joule heating, also known as ohmic heating or resistive heating, occurs when electrically charged particles transfer a portion of their kinetic energy to atoms that make up the body of the NDR device. As described above, this raises the temperature of the NDR device and influences the distribution of electrical carriers within the device.

The NDR device is then used in a circuit for its intended purpose. For example, the NDR device may be used as a memory device, oscillator, transistor, programmable logic, fuzzy computing or other purpose. After use, the electrical power can be removed or disconnected from the stateful NDR device (block 810). When the stateful NDR device is again needed, power-up energy is applied to the device such that it returns to the predetermined state (block 815). This process can be repeated as desired.

The description above is only one example of a method for operation of stateful NDR devices. A variety of alterations to the method can be made, including adding, deleting, combining, or reordering the blocks. For example, programming energy can be applied at any suitable time to copy the NDR state to a memristive element within the NDR device. In one example, the power down sequence for a circuit that includes a NDR device may include programming the NDR device to maintain its last state prior to powering down.

In sum, stateful the NDR devices that are described store their state when power is removed. The state information is stored using nonvolatile hysteresis in a memristive device. When the NDR device is powered up, the device consistently returns to its previous state. These NDR devices can significantly reduce the power consumption of circuits they are incorporated in, leading to more efficient energy use and longer battery lifetimes.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A stateful NDR device comprising:
    a first conductive electrode;
    a second conductive electrode;
    a first material with a reversible, nonvolatile resistance that changes based on applied electrical energy; and
    a second material comprising a differential resistance that is negative in a locally active region, in which the first material and second material are sandwiched between the first conductive electrode and second conductive electrode;
    in which changes in the resistance of the first material create hysteresis in negative differential resistance behavior of the stateful NDR device such that the stateful NDR device exhibits an low resistance I-V curve with a first metastable point located at a point of maximum negative slope, and high resistance I-V curve with a second metastable point located at a point of maximum negative slope.

2. The device of claim 1, in which the first material is a bipolar memristive element.

3. The device of claim 1, in which a bipolar memristive element comprises one of: tantalum oxide ($Ta_2O_5$), hafnium oxide ($HfO_2$), titanium oxide ($TiO_2$) and zirconium oxide ($ZrO_2$).

4. The device of claim 1, in which the first material is a unipolar memristive element for exhibiting a metal-insulator transition induced by Joule-heating.

5. The device of claim 1, in which the first material is a thin film of unipolar memristive material interposed between the first electrode and the second material.

6. The device of claim 1, in which the first material exhibits a nonlinear resistance change based on a magnitude and duration of the applied electrical energy.

7. The device of claim 1, in which the applied electrical energy comprises an electrical current passing through the stateful NDR device sufficient to produce a Joule heating induced metal-insulator transition in the first material.

8. The device of claim 1, in which the low resistance I-V curve comprises an N-type low resistance I-V curve comprising:
    a first section where increasing low voltages result in increasing current flow through the device;
    a second section where increasing voltages result in lower current flow through the device;
    the first metastable point located in the second section at the point of maximum negative slope; and
    a third section where increasing voltages again result in higher currents flowing through the device.

9. The device of claim 8, in which the high resistance I-V curve comprises an N-type high resistance I-V curve comprising the second metastable point located at the point of maximum negative slope, in which nonlinear hysteresis between the high N-type resistance I-V curve and the low N-type resistance I-V curve is sufficient that the first metastable point and the second metastable point of the device are offset such that there is at least one power-up voltage that is less than the first metastable point and greater than the second metastable point.

10. The device of claim 1, in which the low resistance I-V curve comprises an S type low resistance I-V curve comprising:
    a first section where increasing current flow through the device results in increasing voltages across the device;

a second section where increasing current flow through the device results in decreasing voltages across the device;
the first metastable point located in the second section at a point of maximum negative slope; and
a third section where increasing current flow through the device results in increasing voltages across the device.

11. The device of claim 10, in which the high resistance I-V curve comprises an S type high resistance I-V curve comprising the second metastable point located at a point of maximum negative slope, in which nonlinear hysteresis between the S type high resistance I-V curve and the S type low resistance I-V curve is sufficient that the first metastable point and the second metastable point of the device are offset such that there is at least one power-up current that is less than the first metastable point and greater than the second metastable point.

12. The device of claim 1, in which the first material and the second material are comprised of a single layer comprising one of: titanium oxide, vanadium oxide, and niobium oxide.

13. A method for using a stateful NDR device comprising:
applying programming energy to the stateful NDR device to set a state of the stateful NDR device to a non-volatile predetermined state;
removing electrical power from the stateful NDR device; and
applying power-up energy to the stateful NDR device such that the stateful NDR device returns to the predetermined state.

14. The method of claim 13, in which the stateful NDR device comprises a unipolar memristive element and in which applying power-up energy to the stateful NDR device comprises applying a voltage bias across the unipolar memristive element such that Joule-heating heats at least a portion of the unipolar memristive element past a metal-insulator transition temperature to form a metallic phase conductive filament through the unipolar memristive element.

15. The method of claim 14, further comprising:
applying a first programming voltage having a first polarity to alter electrical resistance from a first state to a second state of the unipolar memristive element; and
applying a second programming voltage with a same polarity as the first programming voltage and a different magnitude such that the metallic phase conductive filament is dissipated and electrical resistance of the unipolar memristive element is increased.

16. The method of claim 13, further comprising:
applying a first programming voltage having a first polarity to alter electrical resistance of a bipolar memristive element in the stateful NDR device from a first state to a second state of the bipolar memristive element; and
applying a second programming voltage having a second polarity to return the electrical resistance of the bipolar element from the second state to the first state.

17. The method of claim 13, in which applying power-up energy to the stateful NDR device comprises applying power-up energy at a level that is between a first metastable point located at a point of maximum negative slope on a high resistance I-V curve of the NDR device and a second metastable point located a point of maximum negative slope on a low resistance I-V curve on the NDR device.

18. A circuit comprising:
a stateful NDR device comprising:
a first material with a reversible, nonvolatile resistance that changes based on applied programming energy;
a second material comprising a differential resistance that is negative in a locally active region, in which changes in the resistance of the first material create hysteresis in negative differential resistance behavior of the stateful NDR device such that the stateful NDR device exhibits an low resistance I-V curve with a first metastable point located at a point of maximum negative slope, and high resistance I-V curve with a second metastable point located at a point of maximum negative slope; and
a power up voltage selected to be less than a first metastable point and greater than the second metastable point such that when the power up voltage is applied to the stateful NDR device, stateful NDR device returns to a predetermined state.

19. The circuit of claim 18, further comprising:
a linear resistor; and
a voltage source;
in which the linear resistor is in series with the stateful NDR device such that when a voltage from the voltage source is applied across the linear resistor and the stateful NDR device, a linear load line is created that uniquely intersects each of the low resistance I-V curve and the high resistance I-V curve.

20. The circuit of claim 18, in which the power up voltage is sufficient to turn ON the stateful NDR device if the nonvolatile resistance is in a low resistance state, but insufficient to turn ON the stateful NDR device if the nonvolatile resistance is in a high resistance state.

* * * * *

UNITED STATES PATENT AND TRADEMARK OFFICE
CERTIFICATE OF CORRECTION

| | |
|---|---|
| PATENT NO. | : 8,611,133 B2 |
| APPLICATION NO. | : 13/346219 |
| DATED | : December 17, 2013 |
| INVENTOR(S) | : Matthew D. Pickett et al. |

Page 1 of 1

It is certified that error appears in the above-identified patent and that said Letters Patent is hereby corrected as shown below:

In the Claims

In column 10, line 13, in Claim 17, after "located" insert -- at --.

Signed and Sealed this
Twentieth Day of May, 2014

Michelle K. Lee
*Deputy Director of the United States Patent and Trademark Office*